United States Patent
Tsuruda et al.

(10) Patent No.: US 10,248,030 B2
(45) Date of Patent: Apr. 2, 2019

(54) PROCESS RECIPE EVALUATION METHOD, STORAGE MEDIUM, ASSISTING DEVICE FOR PROCESS RECIPE EVALUATION, AND LIQUID PROCESSING APPARATUS

(71) Applicant: TOKYO ELECTRON LIMITED, Tokyo (JP)

(72) Inventors: Toyohisa Tsuruda, Koshi (JP); Yuichiro Kunugimoto, Koshi (JP); Takafumi Hayama, Koshi (JP); Keishi Hamada, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/897,477

(22) Filed: Feb. 15, 2018

(65) Prior Publication Data
US 2018/0239257 A1    Aug. 23, 2018

(30) Foreign Application Priority Data
Feb. 22, 2017 (JP) ................. 2017-031172

(51) Int. Cl.
*G03F 7/20* (2006.01)
*G03F 7/30* (2006.01)
*H01L 21/67* (2006.01)
*G06F 17/30* (2006.01)

(52) U.S. Cl.
CPC ............ *G03F 7/705* (2013.01); *G03F 7/3021* (2013.01); *G06F 17/30979* (2013.01); *H01L 21/67023* (2013.01); *H01L 21/67051* (2013.01)

(58) Field of Classification Search
None
See application file for complete search history.

(56) References Cited

U.S. PATENT DOCUMENTS

2011/0308549 A1* 12/2011 Minami ............ H01L 21/02052
134/18

FOREIGN PATENT DOCUMENTS

JP    2011-23671 A    2/2011

* cited by examiner

*Primary Examiner* — Michelle M Iacoletti
(74) *Attorney, Agent, or Firm* — Nath, Goldberg & Meyer; Jerald L. Meyer

(57) ABSTRACT

A method for evaluating a process recipe used in a liquid processing apparatus that performs a liquid processing by supplying a processing liquid from a nozzle to a substrate while rotating a holding part horizontally holding the substrate about a vertical axis, includes: storing the process recipe in a first storage part, which includes time-series data of a first combination of parameter values including a position of the nozzle and a rotation speed of the substrate; reading the process recipe from the first storage part; reading a pre-prepared risk data from a second storage part, which is determined by associating a second combination of parameter values with a risk information corresponding to a liquid splash risk; and displaying an assisting data for the first combination of parameter values in the process recipe, based on the process recipe and the pre-prepared risk data read from the first and second storage parts.

9 Claims, 12 Drawing Sheets

FIG. 5

| Step | Time | Wafer rotation speed | Developing solution supply position | Supply flow rate | Acceleration/ deceleration |
|---|---|---|---|---|---|
| 1 | $t_1$ | $r_1$ | $P_1$ | $F_1$ | $d_1$ |
| 2 | $t_2$ | $r_2$ | $P_2$ | $F_2$ | $d_2$ |
| 3 | $t_3$ | $r_3$ | $P_3$ | $F_3$ | $d_3$ |
| 4 | $t_4$ | $r_4$ | $P_4$ | $F_4$ | $d_4$ |
| 5 | $t_5$ | $r_5$ | $P_5$ | $F_5$ | $d_5$ |
| 6 | $t_6$ | $r_6$ | $P_6$ | $F_6$ | $d_6$ |
| ---- | ---- | ---- | ---- | ---- | ---- |

FIG. 8

| Measurement step | Time | Wafer rotation speed (rpm) | Developing solution supply position (mm) | Supply flow rate (ml/min) | Liquid splash number |
|---|---|---|---|---|---|
| 1 | 20 | 500 | -146 | 300 | 374 |
| 2 | 1 | 500 | -146 | 0 | 0 |
| 3 | 20 | 1000 | -146 | 300 | 771 |
| 4 | 1 | 1000 | -146 | 0 | 0 |
| 5 | 20 | 1500 | -146 | 300 | 1195 |
| 6 | 1 | 1500 | -146 | 0 | 0 |
| 7 | 20 | 2000 | -146 | 300 | 1597 |
| 8 | 1 | 2000 | -146 | 0 | 0 |
| 9 | 20 | 500 | -116 | 300 | 239 |
| 10 | 1 | 500 | -116 | 0 | 0 |
| 11 | 20 | 1000 | -116 | 300 | 477 |
| ⋮ | ⋮ | ⋮ | ⋮ | ⋮ | ⋮ |

FIG. 10

| No. | Rotation speed (rpm) | Supply position (mm) | Assumed liquid splash number (per second) |
|---|---|---|---|
| 0 | 0 | −150 | 54.777 |
| 1 | 10 | −150 | 60.217 |
| 2 | 20 | −150 | 65.724 |
| 3 | 30 | −150 | 71.299 |
| 4 | 40 | −150 | 76.939 |
| 5 | 50 | −150 | 82.645 |
| ⋮ | ⋮ | ⋮ | ⋮ |

PROCESS RECIPE EVALUATION METHOD, STORAGE MEDIUM, ASSISTING DEVICE FOR PROCESS RECIPE EVALUATION, AND LIQUID PROCESSING APPARATUS

CROSS-REFERENCE TO RELATED APPLICATION

This application is based upon and claims the benefit of priority from Japanese Patent Application No. 2017-031172, filed on Feb. 22, 2017, the entire contents of which are incorporated herein by reference.

TECHNICAL FIELD

The present disclosure relates to a technique for evaluating a process recipe of a liquid processing apparatus that performs a liquid processing by supplying a processing liquid to a substrate, and a liquid processing apparatus using the technique.

BACKGROUND

In a photolithography process in the manufacture of a semiconductor device, a resist film is formed, a developing solution is supplied to a substrate exposed along a predetermined pattern, and a resist pattern is formed. For example, a developing apparatus has been used in a developing process in which a developing solution is discharged from a developing solution nozzle toward a semiconductor wafer (hereinafter referred to as "wafer") that is horizontally held to form a liquid stagnation on the surface of the wafer W, and the liquid stagnation is expanded on the wafer W by the movement of a developing solution nozzle and the rotation of the wafer W.

In such a developing apparatus, when the rotation speed of a substrate as the wafer is high, there is a possibility that liquid splash occurs in which the developing solution rebounds when the developing solution discharged from the nozzle comes into contact with the surface of the wafer. For this reason, a manufacturer prepares a recommended process recipe for preventing liquid from splashing and incorporates the process recipe into a developing apparatus.

Moreover, when using a coating and developing apparatus, a user may sometimes change a recipe in a developing process in order to control the line width and default of a pattern formed on a wafer. At that time, depending on the rotation speed of the wafer in the process recipe, the supply amount of a processing liquid or the like, liquid splash may easily occur. Thus, there is a possibility that the entire module is contaminated or a possibility that droplets accumulate on a nozzle arm and eventually fall due to the accumulated mass.

SUMMARY

Sonic embodiments of the present disclosure provide a technique capable of evaluating the risk of liquid splash in a process recipe, in a liquid processing apparatus that performs a liquid processing on a substrate by supplying a processing liquid to the substrate and rotating the substrate.

According to one embodiment of the present disclosure, there is provided a method for evaluating a process recipe used in a liquid processing apparatus that performs a liquid processing by supplying a processing liquid from a nozzle to a substrate while rotating a holding part horizontally holding the substrate about a vertical axis, including: storing the process recipe in a first storage part, the process recipe including time-series data of a first combination of parameter values including a position of the nozzle and a rotation speed of the substrate; reading the process recipe from the first storage park; reading a pre-prepared risk data from a second storage part, the pre-prepared risk data being determined by associating a second combination of parameter values with a risk information corresponding to a liquid splash risk; and displaying an assisting data as a liquid splash risk information for the first combination of parameter values in the process recipe, based on the process recipe read from the first storage part and the pre-prepared risk data read from the second storage part.

According to another embodiment of the present disclosure, there is provided a non-transitory computer-readable storage medium for storing an assisting software used in a liquid processing apparatus that performs a liquid processing by supplying a processing liquid from a nozzle to a substrate while rotating a holding part that horizontally holds the substrate about a vertical axis, wherein the assisting software includes a program for executing a series of operations including: reading a process recipe from a first storage part, the process recipe including time-series data of a first combination of parameter values including a position of the nozzle and a rotation speed of the substrate; reading a pre-prepared risk data from a second storage part, the pre-prepared risk data being determined by associating a second combination of parameter values with a risk information corresponding to a liquid splash risk; and preparing an assisting data as a liquid splash risk information for the first combination of parameter values in the process recipe, based on the process recipe read from the first storage part and the pre-prepared risk data read from the second storage part.

According to another embodiment of the present disclosure, there is provided an assisting device for process recipe evaluation used in a liquid processing apparatus that performs a liquid processing by supplying a processing liquid from a nozzle to a substrate while rotating a holding part that horizontally holds the substrate about a vertical axis, including: an input part configured to input a process recipe that includes time-series data of a first combination of parameter values including a position of the nozzle and a rotation speed of the substrate; a first storage part that stores the process recipe inputted by the input part; a second storage part that stores a risk data determined by associating a risk information corresponding to a liquid splash risk with a second combination of parameter values including the position of the nozzle and the rotation speed of the substrate; an assisting data preparation part configured to prepare an assisting data as a liquid splash risk information for the first combination of parameter values in the process recipe, based on the process recipe stored in the first storage part and the risk data stored in the second storage part; and a display part configured to display the liquid splash risk information prepared in the assisting data preparation part.

According to another embodiment of the present disclosure, there is provided a liquid processing apparatus, including: a liquid processing module provided with a holding part surrounded by a cup body and configured to perform a liquid processing by supplying a processing liquid from a nozzle to a substrate while rotating the holding part that horizontally holds the substrate about a vertical axis; and the aforementioned assisting device for process recipe evaluation.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a schematic diagram showing an example of a process recipe of a developing apparatus.

FIG. 8 is a schematic diagram showing a recipe for risk data preparation.

FIG. 10 is a schematic diagram showing the risk data prepared from a three-dimensional model.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
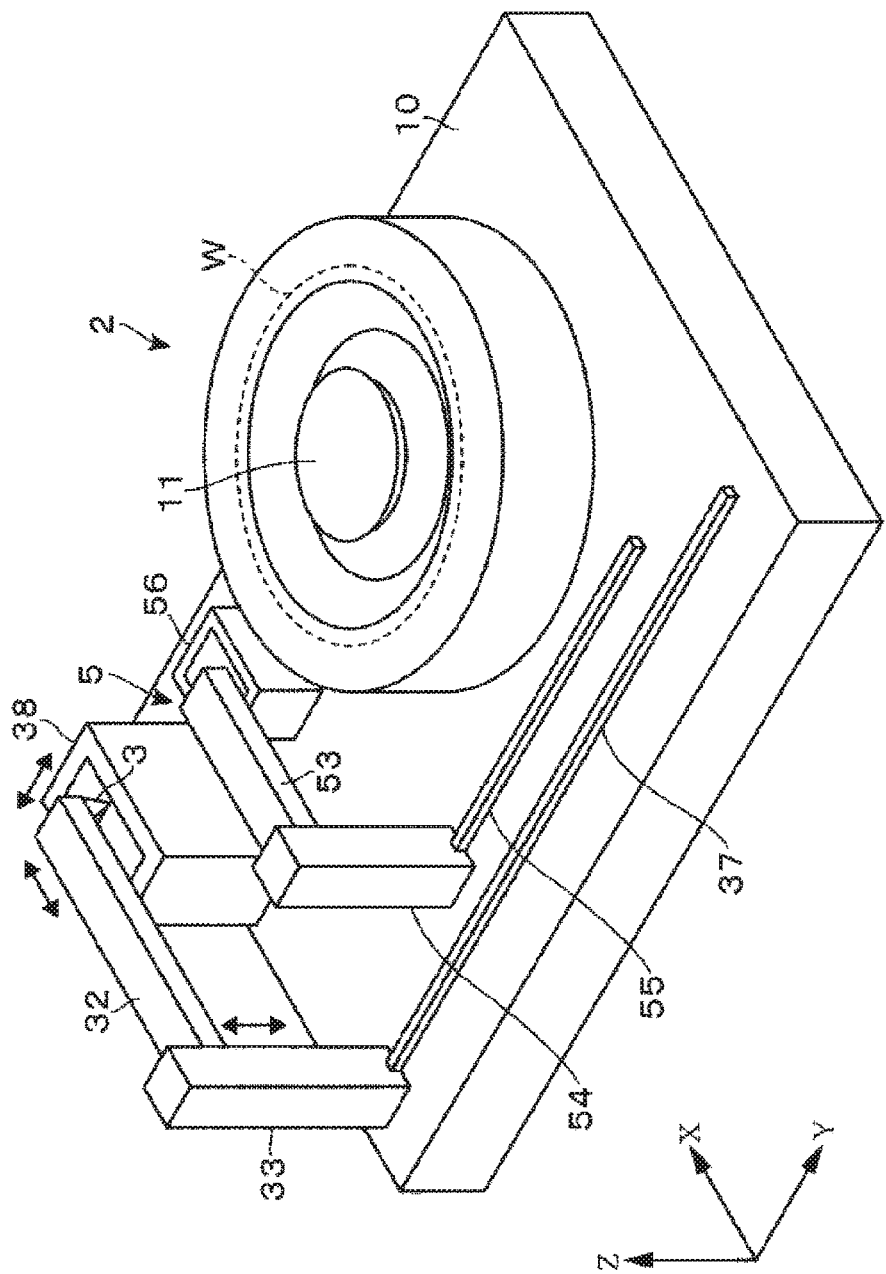
FIG. 1 is a perspective view showing a developing apparatus.
Figure 2:
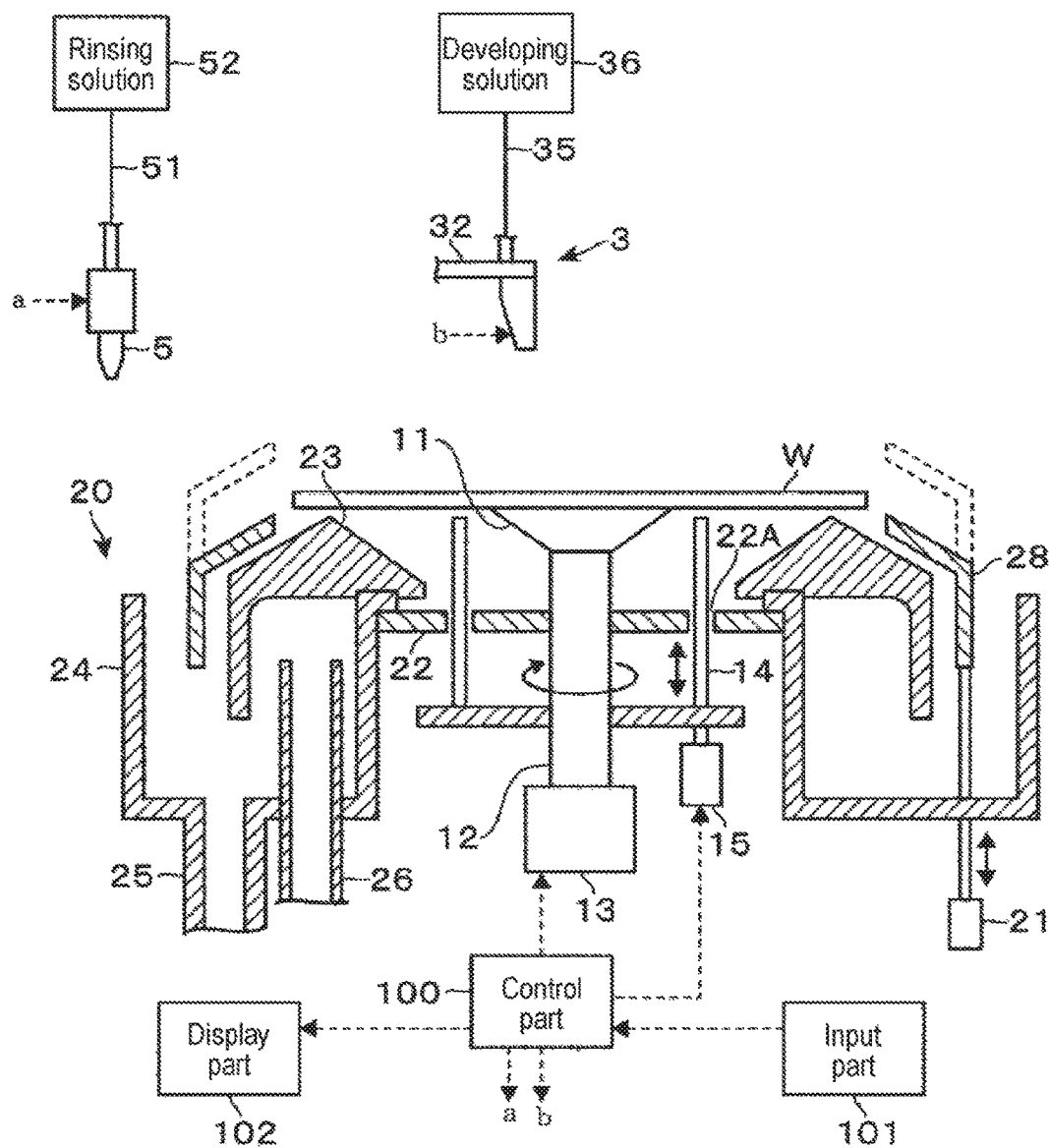
FIG. 2 is a vertical sectional view showing a developing apparatus.

Before explaining a process recipe evaluation device according to an embodiment of the present disclosure, for example, a developing apparatus that performs a developing process of a circuit pattern by supplying a developing solution to an exposed wafer W will be briefly described as an example of a liquid processing apparatus using a process recipe to process a substrate. As shown in FIGS. 1 and 2, the developing apparatus includes a developing module 2. The developing module 2 includes a spin chuck 11 which is a holding part that attracts and horizontally holds the central portion of a back surface of a wafer W. The spin chuck 11 is connected to a rotation mechanism 13 via a rotating shaft 12. The spin chuck 11 is configured to be rotatable about a vertical axis via the rotation mechanism 13 while holding the wafer W.

A circular plate 22 is provided below the spin chuck 11 so as to surround the rotating shaft 12 via a gap. Three through-holes 22A are formed in the circular plate along the circumferential direction. Lift pins 14 configured to be movable up and down by a lift mechanism 15 are inserted into the respective through-holes 22A.

Further, a cup body 20 is provided so as to surround the spin chuck 11. The cup body 20 receives a liquid spun off from the wafer W and guides the liquid downward. The waste liquid flowing downward from the cup body 20 is drained through a drainage path 25, and the interior of the cup body 20 is exhausted through an exhaust pipe 26. In FIG. 2, reference numeral 28 denotes an upper guide portion configured to be movable up and down by an elevating mechanism 21, reference numeral 23 denotes a mountain-shaped guide portion for guiding the liquid to the outer peripheral side, reference numeral 24 denotes a liquid receiving portion that receives the liquid at the lateral side of the upper guide portion 28.

Figure 3:
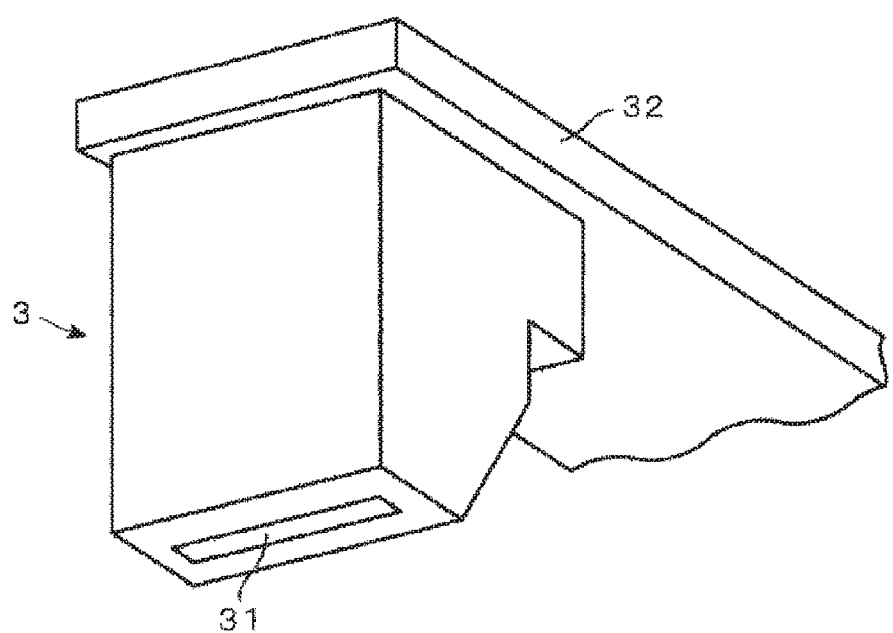
FIG. 3 is a perspective view showing a developing solution nozzle.

The developing apparatus further includes a developing solution nozzle 3 for supplying a developing solution to the wafer W held by the developing module 2. As shown in FIG. 3, the developing solution nozzle 3 is formed in a substantially rectangular shape. A slit 31 serving as a discharge port of the developing solution is opened in the lower surface of the developing solution nozzle 3. As shown in FIG. 2, the downstream end of a developing solution supply pipe 35 leading to the slit 31 is connected to the developing solution nozzle 3. The upstream side of the developing solution supply pipe 35 is connected to, for example, a developing solution supply part 36 that includes a flow rate control part and a developing solution supply source in which a developing solution is stored.

As shown in FIGS. 1 and 2, the developing solution nozzle 3 is supported by an arm 32 extending horizontally. The arm 32 is provided on a moving body 33 so as to be raised and lowered by an elevating mechanism (not shown). In addition, the arm 32 is configured to be extendable and contractible. As the arm 32 is extended and contracted, the developing solution nozzle 3 is configured to move horizontally in the X direction in FIG. 1. The moving body 33 is guided and moved along a guide rail 37 provided on a base 10 so as to extend in a direction (Y direction in FIG. 1) orthogonal to the extending direction of the arm 32. Thus, the developing solution nozzle 3 is moved between a region above the wafer W held by the developing module 2 and a nozzle bath 38 provided outside the developing module 2 so as to serve as a standby position of the developing solution nozzle 3.

The developing apparatus further includes a rinsing solution nozzle 5 that supplies a rinsing solution such as pure water or the like to the surface of the wafer W, after the supply of the developing solution to the wafer W. As shown in FIG. 2, the rinsing solution nozzle 5 is connected to a rinsing solution supply source 52 via a rinsing solution supply pipe 51. Referring back to FIG. 1, the rinsing solution nozzle 5 is supported by an arm 53, which is provided on a moving body 54 so as to be raised and lowered by an elevating mechanism (not shown). The moving body 54 is guided and moved along a guide rail 55 so that the rinsing solution nozzle 5 can move between a standby bath 56 provided outside the wafer W and the region above the wafer W.

Figure 4:
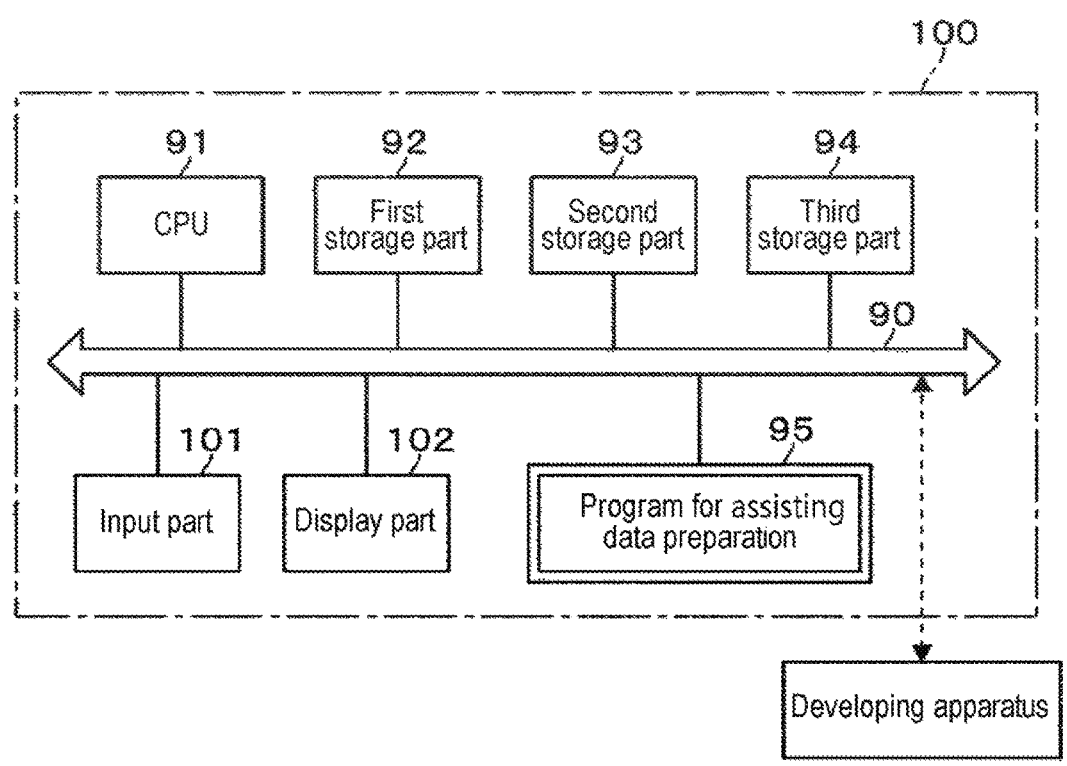
FIG. 4 is a configuration diagram showing a control part including an assisting device for process recipe evaluation.

The developing apparatus is provided with a control part 100 including, for example, a computer. FIG. 4 shows the control part 100 for controlling the developing apparatus. In this example, the control part 100 includes a process recipe evaluation device which is an embodiment of the present disclosure. The control part 100 includes a CPU 91, a first storage part 92, a second storage part 93, and a third storage part 94. In FIG. 4, reference numeral 90 denotes a bus. Further, the control part 100 includes an input part 101 and a display part 102 such as a display or the like for displaying evaluation results of a process recipe to be described later. The input part 101 is configured by, for example, a keyboard or the like, but may be an operation panel including a touch panel that also serves as the display part 102.

Further, the control part 100 includes a program storage part 95 that stores a program for assisting data preparation. This program constitutes assisting software together with the risk data to be described later. The assisting software is stored in the program storage part 95 including a computer storage medium such as a flexible disk, a compact disk, a hard disk, an MO (magneto-optical disk), a memory card or the like and is installed in the control part 100.

In general, in order to carry out a developing process in a developing module using a product wafer, a plurality of process recipes created in advance is prepared. From among the process recipes, a process recipe corresponding to the lot of wafers to be processed is selected. In the present embodiment, for example, when changing a portion of these process recipes, the risk of liquid splash of the changed process recipe is checked in advance using the assisting software so that the risk of liquid splash of the changed process recipe can be used for evaluating the process recipe. The first storage part 92 includes an area for storing the process recipe to be evaluated when the assisting software is being launched.

The process recipe is composed of, for example, a plurality of steps. A rotation speed of the wafer W, a discharge position of the developing solution on the wafer W which corresponds to the position of the nozzle, a nozzle for discharging the developing solution, an acceleration/deceleration for adjusting the rotation speed of the wafer W, an execution time of each step and the like are written in each step. In accordance with the time series of the order of the steps, the rotation speed of the wafer W and the discharge position of the developing solution on the wafer W are executed with the parameter values set in the respective step during the time stored in the respective step, thereby performing a developing process.

Figure 6:
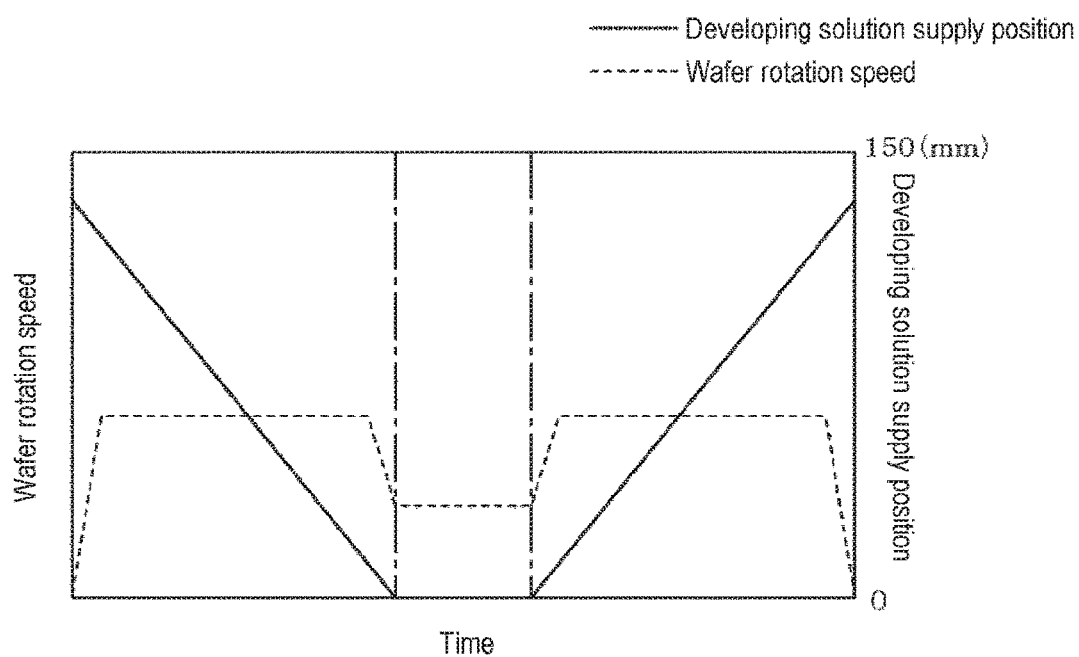
FIG. 6 is a characteristic diagram showing an example of a process recipe of a developing apparatus.

FIG. 5 shows an example of such a process recipe, which includes a step group. FIG. 6 is a graphical representation of the recipe, showing a change in the rotation speed of the wafer W and the supply position of the developing solution as a function of time. The supply position of the developing solution is a position on the wafer W at the intersection of the center axis of the opening of the slit 31, which is opened in the lower surface of the developing solution nozzle 3 and configured to discharge the developing solution, and the surface of the wafer W. In the specification, the center position of the wafer W is described as 0 mm, and the position of the peripheral edge of the wafer W is described as 150 mm. For the convenience of explanation, the recipe is described by simplifying the recipe used in an actual device.

Figure 7:
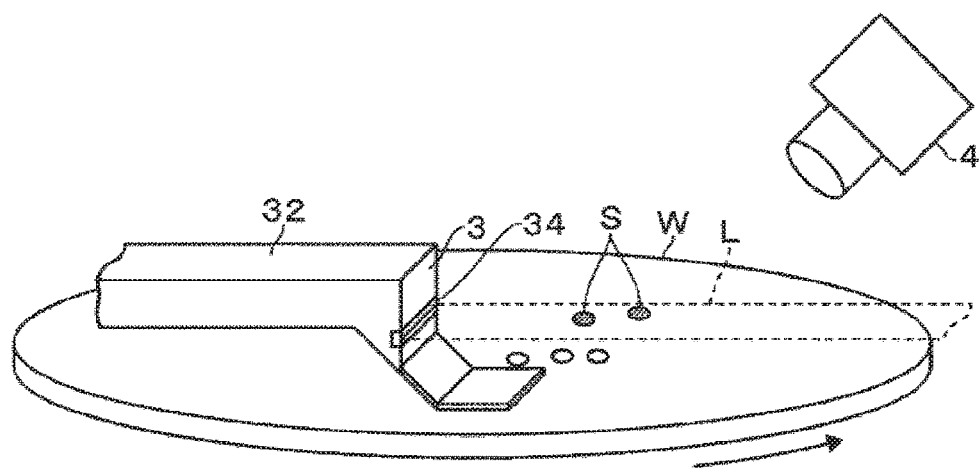
FIG. 7 is an explanatory diagram showing the number of liquid splashes.

The second storage part 93 is an area in which the aforementioned assisting software is installed or downloaded and in which the risk data used for evaluating the recipe to be described later is stored. The risk data is created on the manufacturer side, for example. FIG. 7 shows a developing apparatus for acquiring the risk data, for example, the relative value of the liquid splash number per unit time. In this apparatus, for example, a laser irradiation part 34 for horizontally irradiating a band-like sheet laser beam L toward the front side of the developing solution nozzle 3 is provided in the developing solution nozzle 3 of the developing apparatus shown in FIG. 1. The sheet laser beam L is irradiated, for example, so as to be parallel to the surface of the wafer W. A camera 4 for capturing an image of an optical path of the sheet laser beam L when the developing solution is supplied to the wafer W is provided above the developing module 2.

A method of counting the number of liquid splashes using the camera 4 will be briefly described. After the wafer W is held on the spin chuck 11, the irradiation of the sheet laser beam L is started. Thereafter, the developing solution nozzle 3 is horizontally moved to a position where the developing solution is supplied. The height position of the developing solution nozzle 3 is adjusted and the developing solution is supplied toward the rotating wafer W. At this time, as the developing solution is supplied toward the rotating wafer W, the developing solution may be rebounded by the surface of the wafer W as shown in FIG. 7, and the liquid splashes S may be generated. When the rebounded developing solution moves across the sheet laser beam L irradiated from the laser irradiation part 34, the rebounded liquid splashes are irradiated with the sheet laser beam and shine in a spot shape. In FIG. 7, the liquid splashes S traversing the sheet laser beam L are hatched. In the camera 4, for example, the sheet laser beam L is imaged at 1/60 second intervals. The number of liquid splashes S (liquid droplets) shining in a spot shape, which is confirmed on the sheet laser beam L, for each imaging result, is counted. The counted number of liquid splashes is recorded as the number of liquid splashes S every 1/60 seconds.

Then, by performing a developing process using, for example, a recipe for risk data preparation, data for preparing the risk data is collected. FIG. 8 shows an example of such a recipe for risk data preparation. The recipe for risk data preparation may be, for example, a recipe written so that the respective parameter values of the rotation speed of the wafer W, the position of the developing solution nozzle 3 and the discharge flow rate are combined with each other so as to sequentially execute various combinations of patterns in the order of measurement steps. Then, by executing the recipe according to the time series of the steps, the developing apparatus executes a development process in various patterns of combinations of the rotation speed of the wafer W and the position of the developing solution nozzle 3. Incidentally, the liquid splashes tend to increase at the moment of starting and stopping the discharge of the processing liquid. Therefore, in the example of the recipe for risk data preparation, subsequent to a measurement step of discharging the developing solution, a measurement step of stopping the supply of the developing solution is performed.

Then, when the respective measurement steps of the recipe for risk data preparation are executed in the developing apparatus, as described above, the number of liquid splashes at every 1/60 seconds is counted during the execution of the respective steps. The total number of the liquid splashes counted in the respective measurement steps is obtained and is written and stored in the column of liquid splash number for each step as shown in FIG. 8.

Figure 9:
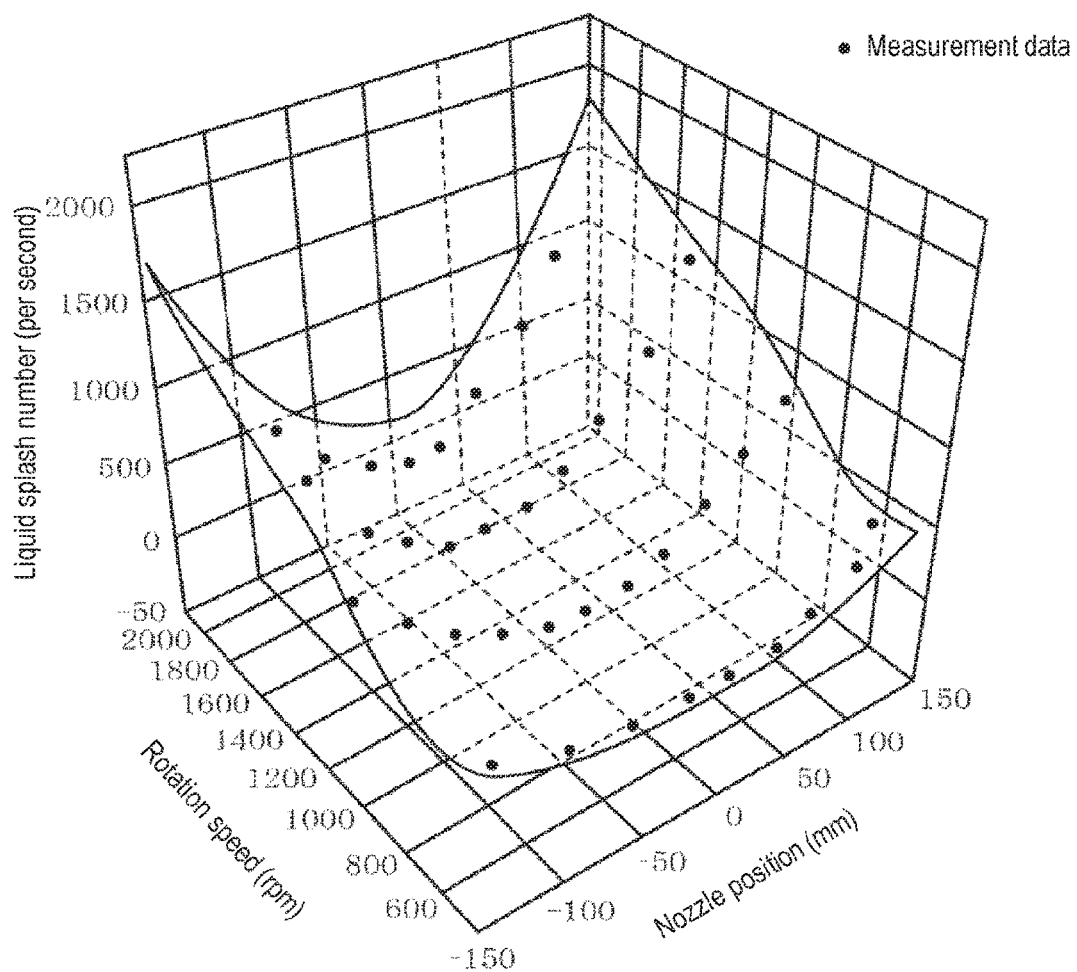
FIG. 9 is a characteristic diagram showing a three-dimensional model prepared from data of each of the measured liquid splashes.

Subsequently, the data on the number of liquid splashes for each measurement step obtained by executing the recipe for risk data preparation is plotted on, for example, a three-dimensional map in which, as shown in FIG. 9, the X axis indicates the rotation speed of the wafer W, the Y axis indicates the position of the nozzle and the Z axis indicates the number of liquid splashes per unit time. Plotted black points in FIG. 9 indicate data measured in the recipe for risk data preparation.

Interpolation of data between the plotted black points is performed by performing, for example, linear interpolation between the respective plotted black points in the three-dimensional map, thereby preparing a three-dimensional model. As an interpolation method, for example, a Kiting method, a spline interpolation, a shepherd method or the like may be used. As a result, it is possible to acquire a calculation formula of a three-dimensional model for calculating the assumed number of liquid splashes using the rotation speed of the water W and the supply position of the developing solution as two variables.

Thereafter, for example, the rotation speed of the wafer W at every 10 rpm and the supply position of the developing solution at every 0.5 mm are combined and applied to the calculation formula of the three-dimensional model. The data on the number of liquid splashes per unit time assumed for each combination of parameters is calculated and extracted. Thus, as shown in FIG. 10, the risk data composed of a table in which the combination of the rotation speed of the wafer W and the supply position of the developing solution is associated with, for example, the assumed number of liquid splashes per unit time as the degree of risk (risk information corresponding to the risk of liquid splash) is prepared and stored in the second storage part 93.

Returning to FIG. 4, a program for assisting data preparation will be described. The program for assisting data preparation reads the parameter value of the process recipe from the first storage part 92 and reads the risk data from the second storage part 93. Then, by referring to the degree of risk corresponding to the combination of the parameter values from the table of the risk data for each combination of the parameter values of the read process recipe, for example, the rotation speed of the wafer W and the supply position of the developing solution, data associating the degree of risk with the combination of the parameter values is obtained. By editing the data, data associating each step of the process recipe with the degree of risk is written in the third storage part 94. In this example, the degree of risk is indicated by the number of liquid splashes assumed at each step. The assumed number of liquid splashes refers to the number assumed to be counted by the aforementioned sheet laser beam and indicates the relative value with respect to the number of liquid splashes occurring in the recipe. Such data written in the third storage part 94 is displayed on the display part 102.

More specifically, in the program for assisting data preparation, for example, a graph for a change in the rotation speed of the wafer W as a function of time and a change in the discharge position of the processing liquid on the wafer W as a function of time is prepared based on the process recipe stored in the first storage part 92. In this process recipe, it is assumed that the discharge of the developing solution is started immediately after the start of the process recipe and is continued until the end of the developing process in the figure.

In the graph thus prepared, every 0.1 second from the start of the process recipe, the number of liquid splashes per unit time calculated from the rotation speed of the wafer W and the discharge position of the processing liquid is read from the risk data stored in the second storage part 93, based on the state of turning on the supply of the developing solution (performing the supply of the developing solution) and turning off the supply of the developing solution (stopping the supply of the developing solution) at that time, the rotation speed of the wafer W and the discharge position of the processing liquid. In this example, since the developing solution is continuously supplied from the start to the end of the process recipe, it is assumed that the supply of the developing solution is always determined to be turned on during the process recipe.

Figure 11:
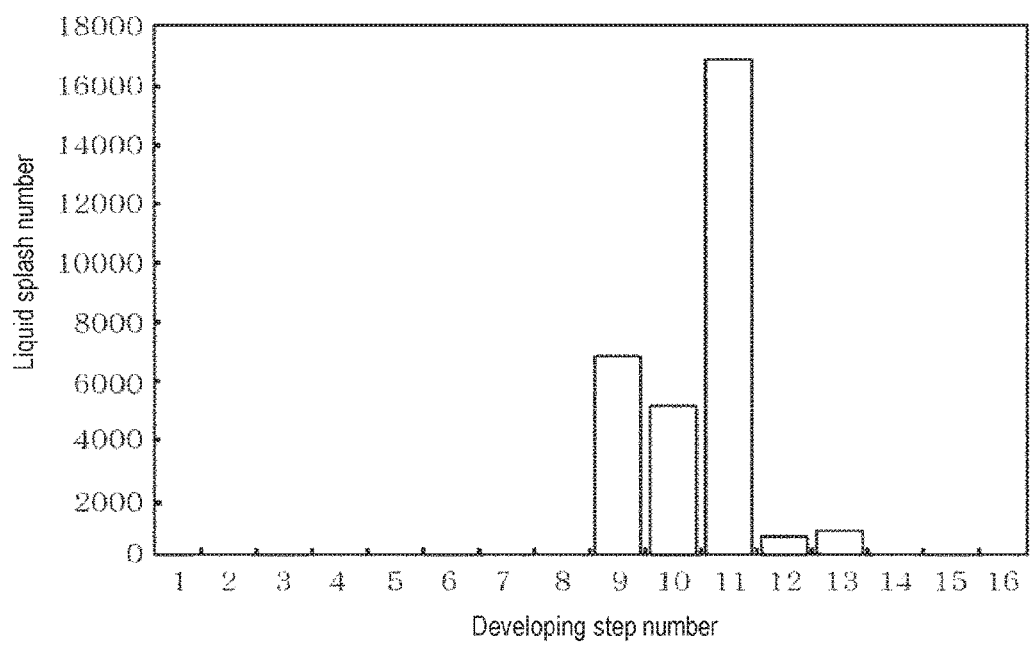
FIG. 11 is an explanatory diagram showing a risk evaluation result displayed on a display part.

As described above, first of all, a graph showing a change in the number of liquid splashes per unit time assumed in the entire process recipe as a function of time is prepared by the number of liquid splashes per unit time calculated every 0.1 second from the start of the process recipe. Further, the total number of liquid splashes assumed from the start to the end of the process recipe when executing the respective process recipe is obtained. In addition, for example, from the graph showing the assumed number of liquid splashes per unit time, the number of liquid splashes is summed for each developing step in the process recipe. For example, the value of the liquid splash number is indicated as the degree of risk. FIG. 11 shows an example of the degree of risk in the process recipe displayed on the display part 102, namely the risk information corresponding to the risk of the liquid splash. In this example, the number of liquid splashes assumed for each step of the process recipe is indicated.

Figure 12:
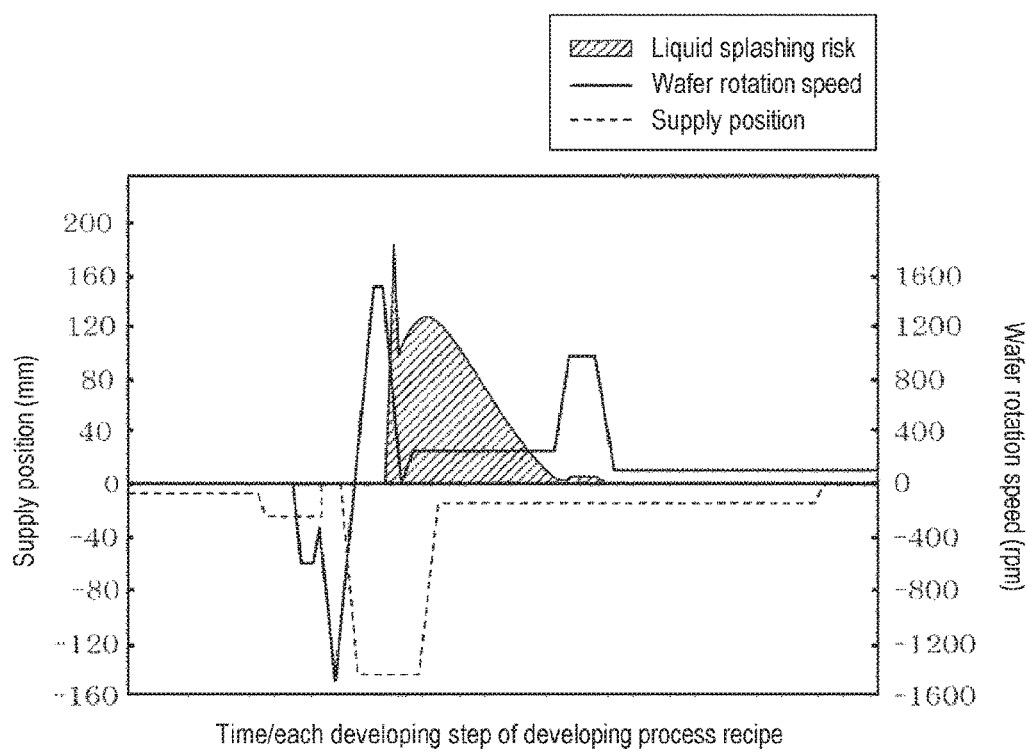
FIG. 12 is a characteristic diagram in which a change in rotation speed of a wafer W and a supply position of a developing solution as a function of time is associated with the degree of liquid splash risk.

In addition, FIG. 12 shows an example of a graph in which a change in the rotation speed of the wafer W as a function of time, a change in the supply position of the developing solution as a function of time and a change in the degree of liquid splash risk as a function of time are associated with each other. Since the details of the process recipe used by a user are often not disclosed, FIGS. 6, 11 and 12 are shown for easily understanding of the present disclosure and are not consistent with each other.

Figure 13:
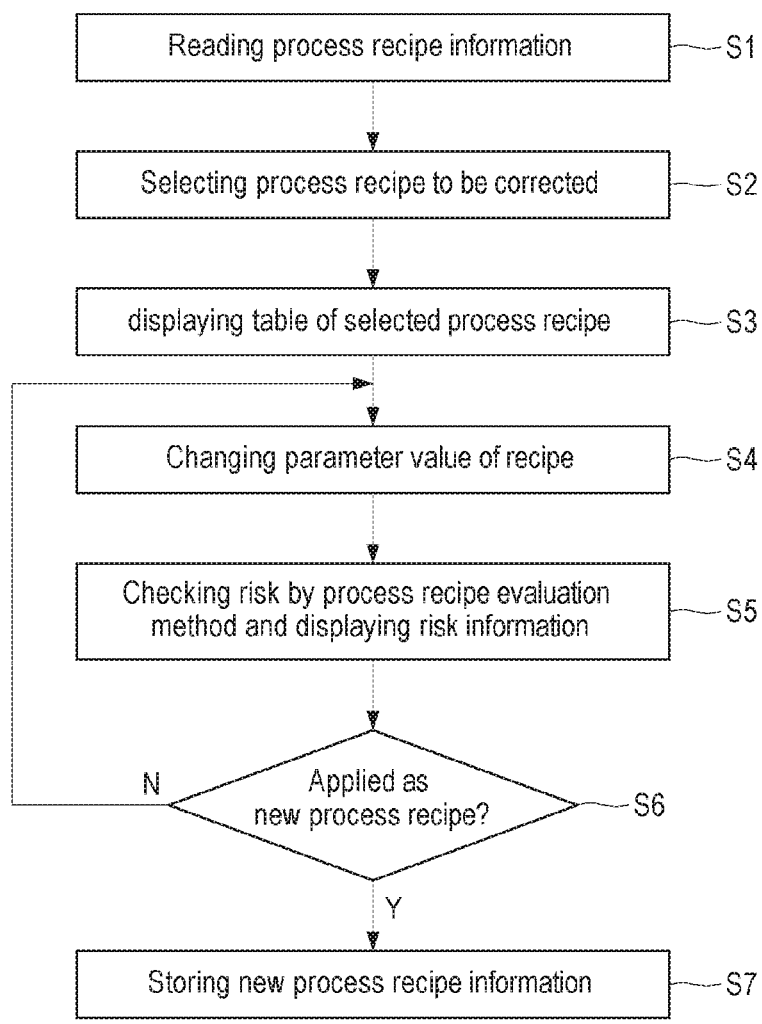
FIG. 13 is a flowchart showing a process recipe changing process.

When the user newly sets a process recipe, as shown in the flowchart of FIG. 13, first, for example, the process recipes stored in the developing apparatus are displayed on the display part 102 (step S1). Then, when the user selects one of the displayed process recipes, which is to be corrected (step S2), the table of process recipes as shown in FIG. 5 in the selected correction-target process recipe is displayed on the display part 102 (step S3).

When the user changes the parameter value in the displayed table of process recipes (step S4), for example, the process recipe with the changed parameter value is stored in the first storage part 92. The evaluation method of the process recipe using the program for assisting data preparation described above is executed to perform a risk check. For example, a graph indicating risk information as shown in FIG. 11 is displayed on the display part 102 (step S5). Furthermore, by referring to the displayed risk information, the user examines whether or not to apply the process recipe in which the parameter has been changed (step S6). If the parameter is to be changed again, the process returns to step S4 Where the parameter values of the process recipe are changed again. When applied as a process recipe, instead of the process recipe selected in step S2, the corrected process recipe is newly stored as process recipe information (step S7).

According to the above-described embodiment, in the developing apparatus, risk data in which the number of liquid splashes corresponds to each combination of the rotation speed of the wafer W and the supply position of the developing solution on the wafer W is prepared in advance in the second storage part 93. When the user prepares a process recipe, the liquid splash risk such as the time-dependent change of the liquid splash number assumed in the process recipe, the total number of liquid splashes assumed in the process recipe, the liquid splash number assumed in each developing step, or the like is displayed from the risk data. Therefore, it is possible for the user to ascertain the liquid splash risk in the newly prepared or changed process recipe. This may contribute to the evaluation of the process recipe.

Figure 14:
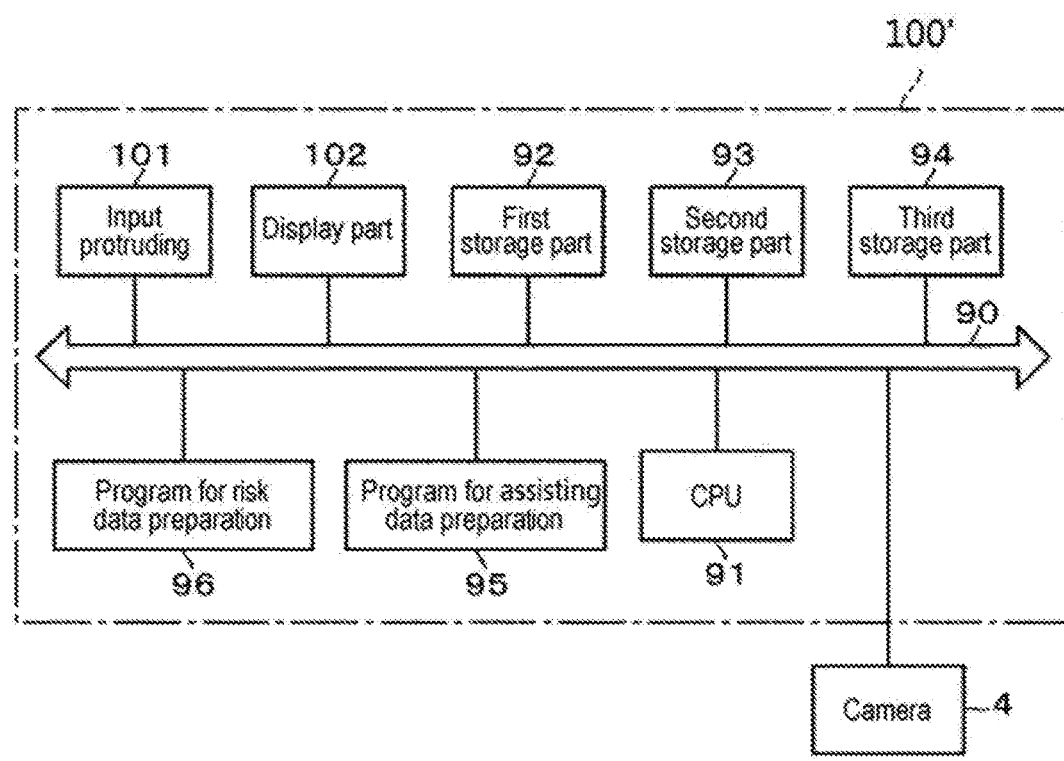
FIG. 14 is a configuration diagram showing a control part used in a liquid processing apparatus according to an embodiment of the present disclosure.

In some embodiments, the user may prepare the risk data using the developing apparatus provided with the camera 4 and the laser irradiation part 34 shown in FIG. 7. FIG. 14 shows a control part 100' used for such a developing apparatus. The control part 100' of the developing apparatus is configured so that the imaging result obtained by the camera 4 is transmitted. A risk data preparation program 96 for preparing risk data is connected. The risk data preparation program 96 executes the recipe for measurement described above and also captures an image of the state of the liquid splash using the camera 4. The risk data preparation program 96 counts the number of liquid splashes corresponding to the parameter set in the recipe for measurement, and stores the number of liquid splashes as data. Further, the three-dimensional model shown in FIG. 9 is prepared and the calculation formula is obtained from the data on the number of liquid splashes with respect to the parameter. A table of risk data shown in FIG. 10 is prepared using the calculation formula. When the user changes the process recipe of the developing apparatus, the risk evaluation program is executed as described above and the recipe is evaluated. In this manner, the camera 4 and the laser irradiation part 34 shown in FIG. 7, and the control part 100' may be provided in the developing apparatus as an actual machine used by the user so that assisting data can be acquired.

Further, in order to calculate the risk of liquid splash such as the assumed number of liquid splashes, as parameter values extracted from the process recipe, it may possible to use the flow rate of the processing liquid, the type of the processing liquid, the hydrophobicity of the surface of the substrate to be processed, and the like. The parameter values are not limited to numerical values, but may be recipe information such as, for example, the type of the processing liquid and the like. In such an example, a data table may be prepared for each type of the processing liquid, and the degree of risk may be calculated from the data table selected based on the recipe information such as the type of the processing liquid read out from the process recipe. In the present specification, such recipe information is also included in the parameter values.

Further, instead of storing the table of the risk data shown in FIG. 9, the calculation formula of the three-dimensional model shown in FIG. 8 may be stored in the second storage part 93, and each parameter value in the set process recipe may be substituted into the calculation formula to evaluate the risk of liquid splash.

As for the display of the liquid splash risk information (assisting data) concerning the combination of the parameter values in the process recipe, for example, a threshold value may be set for the liquid splash number. "With risk" may be displayed for the combination of parameter values exceeding the threshold value, and "Without risk" may be displayed for the combination of parameter values equal to or less than the threshold value.

The present disclosure may be applied to a liquid processing apparatus such as a coating processing apparatus that supplies a coating liquid to a rotating substrate to form a coating film, a cleaning apparatus that supplies a cleaning liquid to a substrate to clean the substrate, or the like.

According to the present disclosure, in a liquid processing apparatus that rotates a substrate that is horizontally held and supplies a processing liquid to a surface of the substrate, parameter values of a process recipe is changed in advance, the number of liquid splashes is measured, and a risk data corresponding to a liquid splash risk according to each parameter value is prepared. When a user prepares the process recipe of the liquid processing apparatus, the liquid splash risk assumed in the process recipe is obtained from the liquid splash risk data and is displayed. Therefore, the user can grasp the liquid splash risk in the newly prepared or changed process recipe. This may contribute to the evaluation of the process recipe.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for evaluating a process recipe used in a liquid processing apparatus that performs a liquid processing by supplying a processing liquid from a nozzle to a substrate while rotating a holding part horizontally holding the substrate about a vertical axis, comprising:

storing the process recipe in a first storage part, the process recipe including time-series data of a first combination of parameter values including a position of the nozzle and a rotation speed of the substrate;

reading the process recipe from the first storage part;

reading a pre-prepared risk data from a second storage part, the pre-prepared risk data being determined by associating a second combination of parameter values with a risk information corresponding to a liquid splash risk; and displaying an assisting data as a liquid splash risk information for the first combination of parameter values in the process recipe, based on the process recipe read from the first storage part and the pre-prepared risk data read from the second storage part.

2. The method of claim 1, wherein the liquid splash risk information is an information corresponding to a generation frequency of liquid particles generated when the processing liquid is discharged from the nozzle onto the substrate.

3. The method of claim 2, wherein the generation frequency of the liquid particles is prepared based on a result of counting the liquid particles based on an imaging result obtained by a camera while irradiating a sheet-shaped laser beam above a surface of the substrate.

4. The method of claim 1, wherein the process recipe is configured by time-serially arranging the first combination of parameter values and a period of time during which the first combination is maintained, and the displaying an assisting data includes displaying the steps and the risk information in association with each other.

5. The method of claim 1, wherein the displaying an assisting data includes displaying the time-series data of the first combination of parameter values and the risk information in association with each other.

6. A non-transitory computer-readable storage medium for storing an assisting software used in a liquid processing apparatus that performs a liquid processing by supplying a processing liquid from a nozzle to a substrate while rotating a holding part that horizontally holds the substrate about a vertical axis, wherein the assisting software includes a program for executing a series of operations including:

reading a process recipe from a first storage part, the process recipe including time-series data of a first combination of parameter values including a position of the nozzle and a rotation speed of the substrate;

reading a pre-prepared risk data from a second storage part, the pre-prepared risk data being determined by associating a second combination of parameter values with a risk information corresponding to a liquid splash risk; and preparing an assisting data as a liquid splash risk information for the first combination of parameter values in the process recipe, based on the process recipe read from the first storage part and the pre-prepared risk data read from the second storage part.

7. The storage medium of claim 6, wherein the assisting software includes the pre-prepared risk data.

8. A assisting device for process recipe evaluation used in a liquid processing apparatus that performs a liquid processing by supplying a processing liquid from a nozzle to a substrate while rotating a holding part that horizontally holds the substrate about a vertical axis, comprising:

an input part configured to input a process recipe that includes time-series data of a first combination of parameter values including a position of the nozzle and a rotation speed of the substrate;

a first storage part that stores the process recipe inputted by the input part;

a second storage part that stores a risk data determined by associating a risk information corresponding to a liquid splash risk a second combination of parameter values including the position of the nozzle and the rotation speed of the substrate;

an assisting data preparation part configured to prepare an assisting data as a liquid splash risk information for the first combination of parameter values in the process recipe, based on the process recipe stored in the first storage part and the risk data stored in the second storage part; and a display part configured to display the liquid splash risk information prepared in the assisting data preparation part.

9. A liquid processing apparatus, comprising:

a liquid processing module provided with a holding part surrounded by a cup body and configured to perform a liquid processing by supplying a processing liquid from a nozzle to a substrate while rotating the holding part that horizontally holds the substrate about a vertical axis; and the assisting device for process recipe evaluation of claim 8.

* * * * *

UNITED STATES PATENT AND TRADEMARK OFFICE
CERTIFICATE OF CORRECTION

PATENT NO. : 10,248,030 B2
APPLICATION NO. : 15/897477
DATED : April 2, 2019
INVENTOR(S) : Toyohisa Tsuruda et al.

It is certified that error appears in the above-identified patent and that said Letters Patent is hereby corrected as shown below:

In the Claims

Claim 8, Column 12, Line 5, please delete the phrase "liquid splash risk a second combination" and replace with "liquid splash risk with a second combination".

Signed and Sealed this
Twenty-first Day of May, 2019

Andrei Iancu
*Director of the United States Patent and Trademark Office*